(12) United States Patent
Chen et al.

(10) Patent No.: US 7,878,821 B2
(45) Date of Patent: Feb. 1, 2011

(54) IC SOCKET HAVING IMPROVED LATCH DEVICE

(75) Inventors: Ke-Hao Chen, Tu-Cheng (TW); Hsiu-Yuan Hsu, Tu-Cheng (TW); Wen-Yi Hsieh, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/549,402

(22) Filed: Aug. 28, 2009

(65) Prior Publication Data

US 2010/0062622 A1     Mar. 11, 2010

(30) Foreign Application Priority Data

Sep. 8, 2008     (TW) .................................. 97216185

(51) Int. Cl.
    *H01R 12/00*     (2006.01)
(52) U.S. Cl. ......................................... 439/72; 439/330
(58) Field of Classification Search .................. 439/72, 439/73, 330
    See application file for complete search history.

(56) References Cited

U.S. PATENT DOCUMENTS

| | | | |
|---|---|---|---|
| 6,162,066 A * | 12/2000 | Glick et al. ................... | 439/73 |
| 6,607,396 B1 * | 8/2003 | Ito ............................... | 439/331 |
| 6,957,965 B2 | 10/2005 | Huang et al. | |
| 7,161,805 B2 * | 1/2007 | Gattuso et al. ............... | 361/704 |
| 7,491,082 B2 * | 2/2009 | Hsu et al. ..................... | 439/330 |
| 2008/0057765 A1 * | 3/2008 | Hsiao et al. .................. | 439/259 |
| 2008/0186659 A1 * | 8/2008 | Chen et al. ................... | 361/679 |
| 2008/0299810 A1 * | 12/2008 | Hsieh et al. ................. | 439/341 |
| 2010/0035447 A1 * | 2/2010 | Chen et al. ..................... | 439/73 |
| 2010/0055960 A1 * | 3/2010 | Hsu et al. ..................... | 439/342 |

* cited by examiner

*Primary Examiner*—Briggitte R. Hammond
*Assistant Examiner*—Larisa Tsukerman
(74) *Attorney, Agent, or Firm*—Andrew C. Cheng; Wei Te Chung; Ming Chieh Chang

(57) ABSTRACT

An IC socket for receiving an IC package comprises a socket body for carrying the IC package. A plurality of contacts are received in the socket body for electrical connection with the IC package. A driving member is mounted upon the socket body and able to operate between an upper position and a lower position. At least one latch device comprises an upper section, a lower section parallel to the upper section and a regulator. The regular links the upper section and the lower section and force the lower section to move relative to the upper section.

15 Claims, 5 Drawing Sheets

IC SOCKET HAVING IMPROVED LATCH DEVICE

BACKGROUND OF THE INVENTION

1. Field of the Invention

The present invention relates to an Integrated Circuit (IC) socket, and more particularly to an IC socket having adjustable latch devices which can be readily adjusted to receive various IC packages of different thicknesses therein for testing purpose.

2. Description of the Prior Art

U.S. Pat. No. 7,121,858 issued to Chen on Oct. 17, 2006 discloses a typical IC socket for interconnecting an IC package and a test board. The IC socket includes a base mounted on the test board, a number of contacts retained in the base, and a driving member mounted upon the base to drive a pair of latch members to press the IC package firmly within the socket. The driving member has a rectangular shape and is manually or automatically operated from an upper position to a lower position. Correspondingly, the latch member is actuated from a closed position to an opened position. During this process, the latch member rotates upwardly and rearwardly to provide a clearance for receiving the IC package. When the latch member is turned form the opened position to the closed position, it then rotates downwardly and forwardly to press the IC package so as to secure the IC package onto the base.

However, due to the rigidity and non-deformability of the latch member, the thicknesses of the IC packages must keep constant. In other words, when a loaded IC package is with a thickness different from previous one, the latch member must be changed with another one to maintain a secured latching effect.

Thus, there is a need to provide a new IC socket that overcomes the above-mentioned problems.

SUMMARY OF THE INVENTION

An object of the present invention to provide an Integrated Circuit (IC) socket having an improved latch device which can be readily adjusted to receive IC packages of different thicknesses.

In order to achieve the object set forth, an IC socket for receiving an IC package comprises a socket body for carrying the IC package. A plurality of contacts are received in the socket body for electrical connection with the IC package. A driving member is mounted upon the socket body and is able to be operated between an upper position and a lower position. At least one latch device is driven by the driving member to shift between a closed position and an opened position. The latch device has an upper section, a lower section located below the upper section and pressing the IC package toward the socket body, and a regulator engaged with the upper section and the lower section respectively to adjust a position of the lower section relative to the upper section.

In order to further achieve the object set forth, an IC socket for receiving an IC package comprises a socket body for carrying the IC package. A plurality of contacts are received in the socket body for electrical connection with the IC package. A driving member is mounted upon the socket body and able to operate between an upper position and a lower position. At least one latch device comprises a latch body with a receiving hole extending in a vertical direction, a regulator is mounted in the receiving hole for adjust a space under the latch body.

DESCRIPTION OF PREFERRED EMBODIMENT

Reference will now be made to the drawings to describe the present invention in detail.

Figure 1:
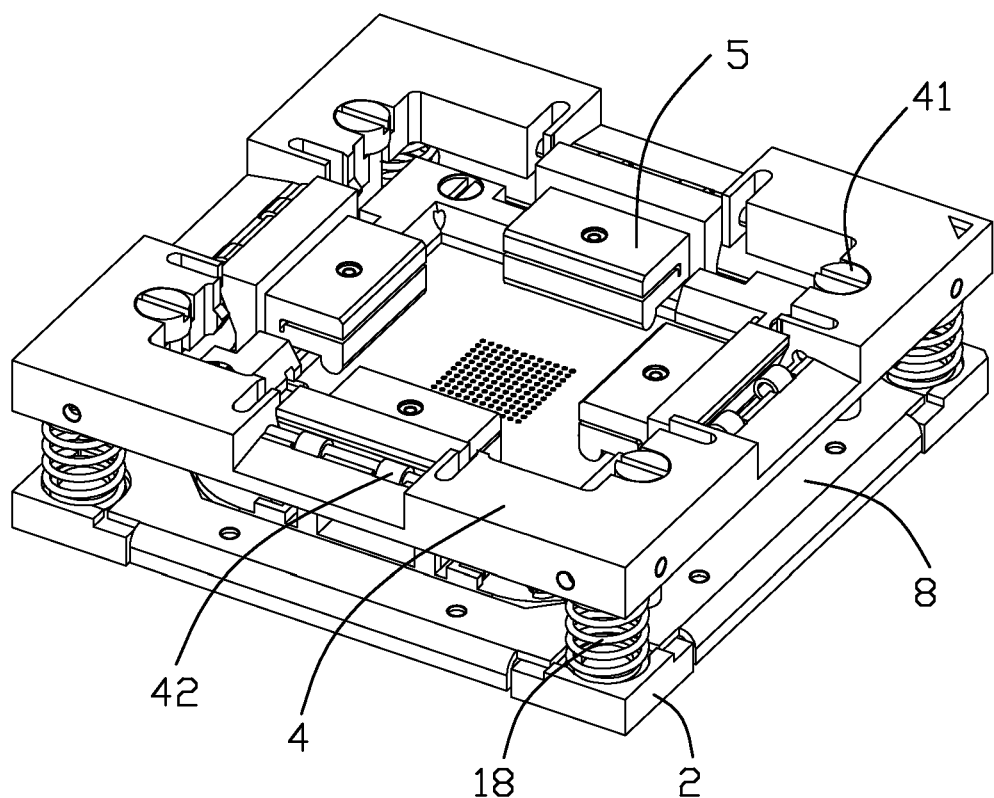
FIG. 1 is an assembled, perspective view of an IC socket in accordance with a preferred embodiment of the present invention.
Figure 2:
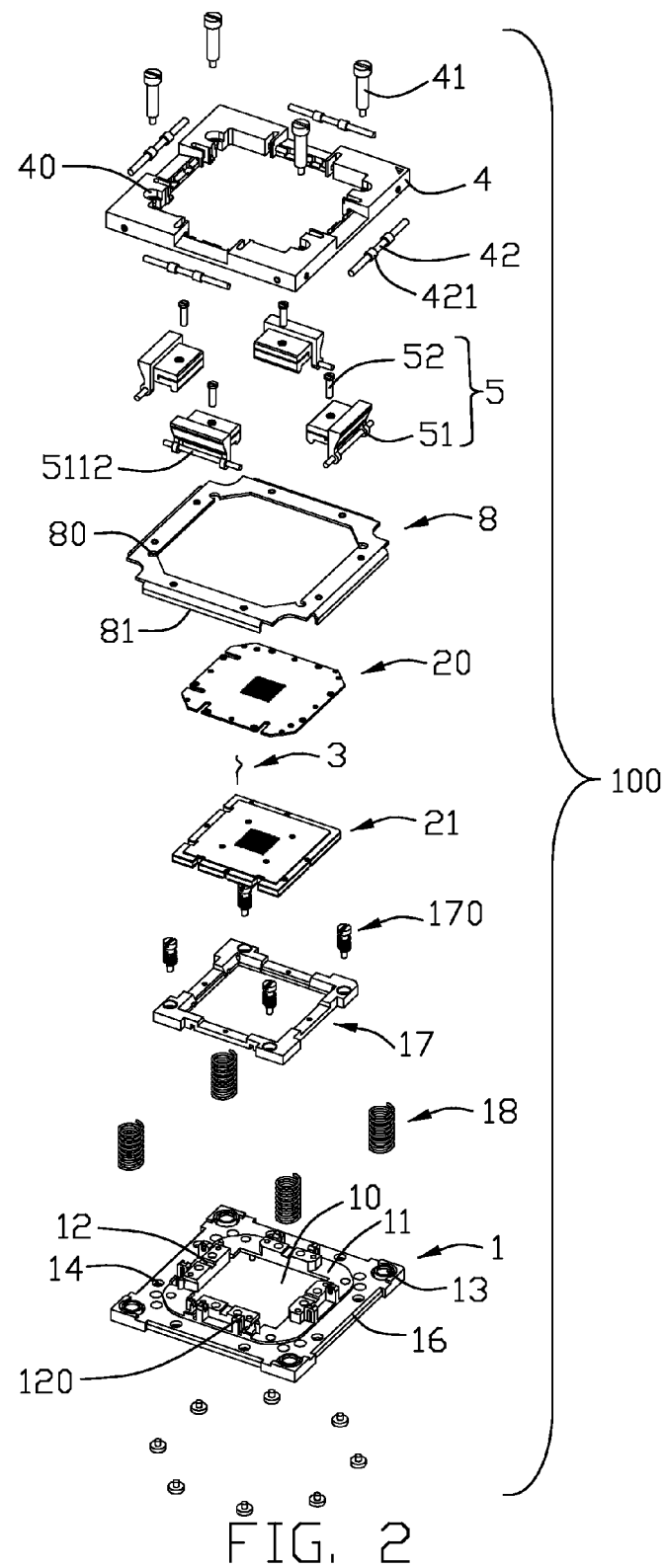
FIG. 2 is an exploded, perspective view of the IC socket shown in FIG 1.

Referring to FIGS. 1-2, an Integrated Circuit (IC) socket 100 made in accordance with a preferred embodiment of the present invention is used for testing an IC package 1 therein. The IC socket 100 includes a socket body (not labeled) for receiving the IC package 1 therein, a plurality of contacts 3 received in the socket body for electrical connection with the IC package 1, and a driving member 4 mounted upon the socket body and is able to be operated between an upper position and a lower position to drive four latch devices 5 assembled on the socket body.

The socket body includes a base 1, a securing frame 17 seated on the base 1 by four bolts 170, a retaining board 21 received in the securing frame 17 for retaining the contacts 3 which are arranged in a matrix array, and an alignment board 20 for aligning the array of the contacts 3. Top ends of the contacts 3 extend beyond the alignment board 20 to contact with the IC package. In addition, an enforcing element 8 is provided to strengthen the socket body. The base 1 has four side edges 11 with an opening 10 therebetween. Four supporting holes 13 are arranged in corners of the base 1 for receiving four springs 18 therein and which provide reciprocal forces for the driving member 4. The enforcing member 8 includes a top plate (not labeled) covering the side edges 11 of the base 1 and four shielding plates 81 extending downwardly from a periphery of the top plate into corresponding recesses 16 defined on the side edge 11 of the base 1. The top plate is configured with a plurality of fixing holes 80, and correspondingly, the base 1 is provided with a plurality of through holes 14 formed on the side edges 11. The driving member 4 defines four mating holes 40 for receiving a plurality of screws 41. The screws 41 pass through the mating holes 40, the fixing holes 80 and the through holes 14 so as to secure the driving member 4 and the enforcing member 8 within the socket body. In addition, four elevated portions 12 extend from the side edges 11 and surround the opening 10. Behind each elevated potion 12 there is a pair of linking portions 120 for mounting the latch device 5. The driving member 4 has four rods 42 with cams 421 adapted to drive the latch device 5 to open and close.

Figure 3:
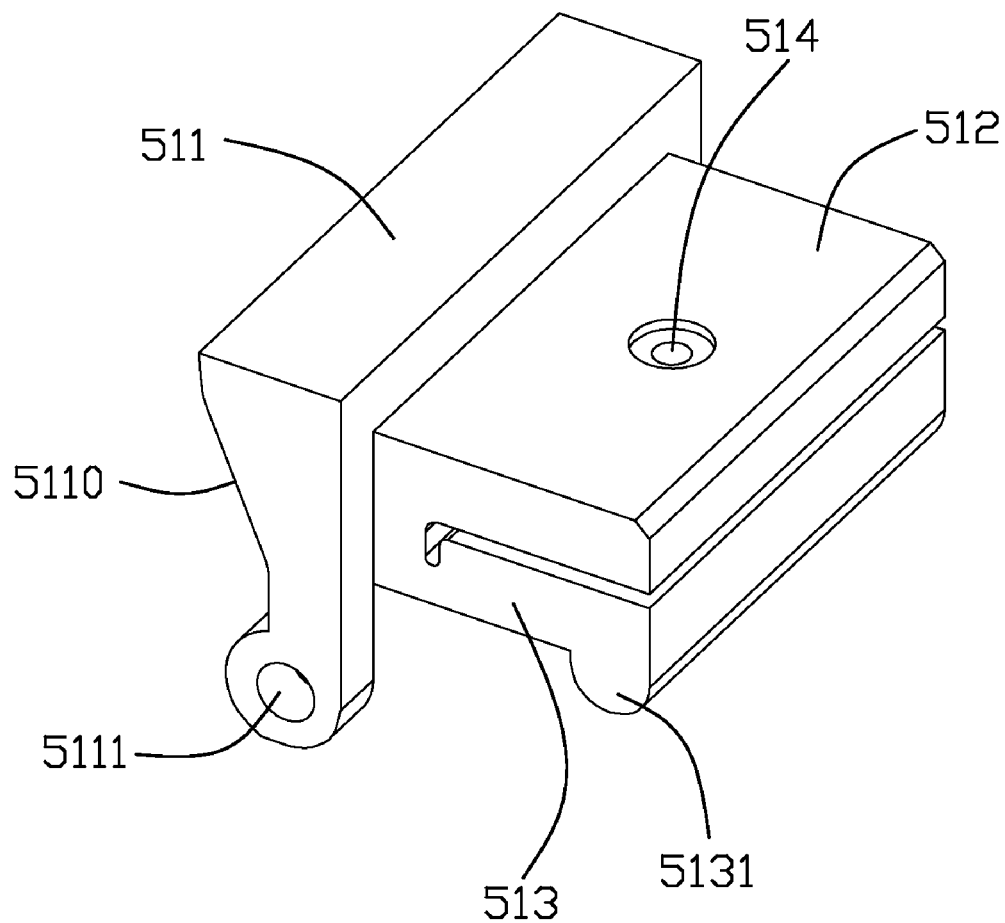
FIG. 3 is a perspective view of a latch device of the IC socket shown in FIG. 1.
Figure 4:
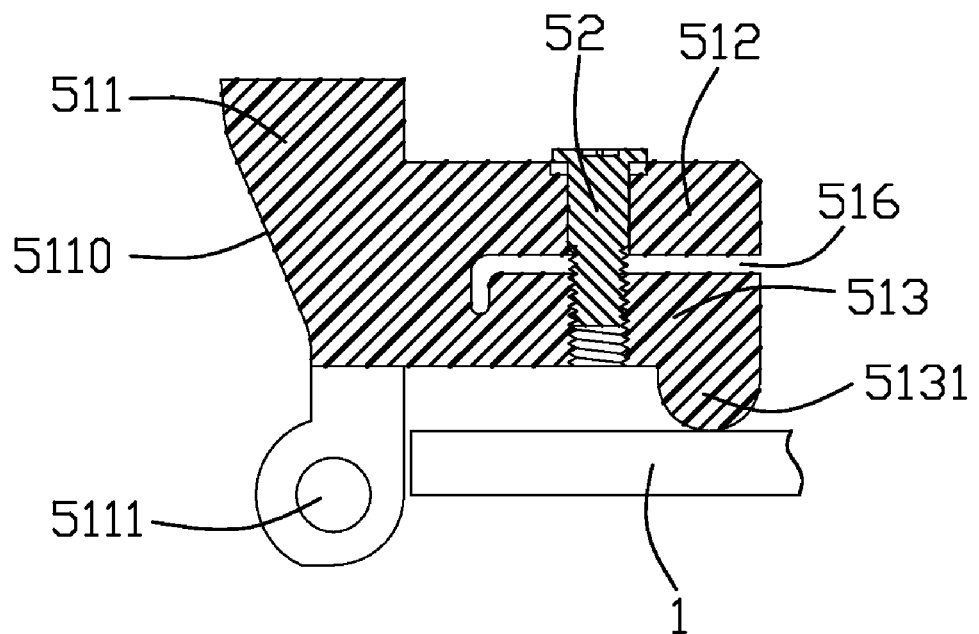
FIG. 4 is a cross-sectional view of the latch device disposed in an initial state.

Particularly referring to FIGS. 2-4, the latch device 5 includes a latch body 51 and a regulator 52 assembled in the latch body 51. The latch body 51 includes an bias portion 511, an upper section 512 extending horizontally from an inner side of the bias portion 511 and a lower section 513 extending horizontally and below the upper section 512. The bias portion 511 has a curved urging surface 5110 opposite to the upper and the lower sections 512, 513 for engaging with the cam 421 of the rod 42. A hole 5111 is defined on a bottom of the bias portion 511 for receiving a shaft 5112. The upper section 512 is integrally formed with the lower section 513. The upper section 512 and the lower section 513 are substantially parallel to each other, and a substantially L-shaped slot 516 is defined between the upper section 512 and the lower section 513 and partially extends into the lower section 513 so that the lower section 513 can be lifted up and lowered down relative to the upper section 512. The lower section 513 includes a projection 5131 at free end thereof for pressing the IC package 1. The upper section 512 and the lower section 513 jointly define a receiving hole 514 passing therethrough to receive the regulator 52. In the present embodiment, the regulator 52 is a screw, and a part of the receiving hole 514 passing through the lower section 513 has internal threads to engage with the regulator 52.

Figure 5:
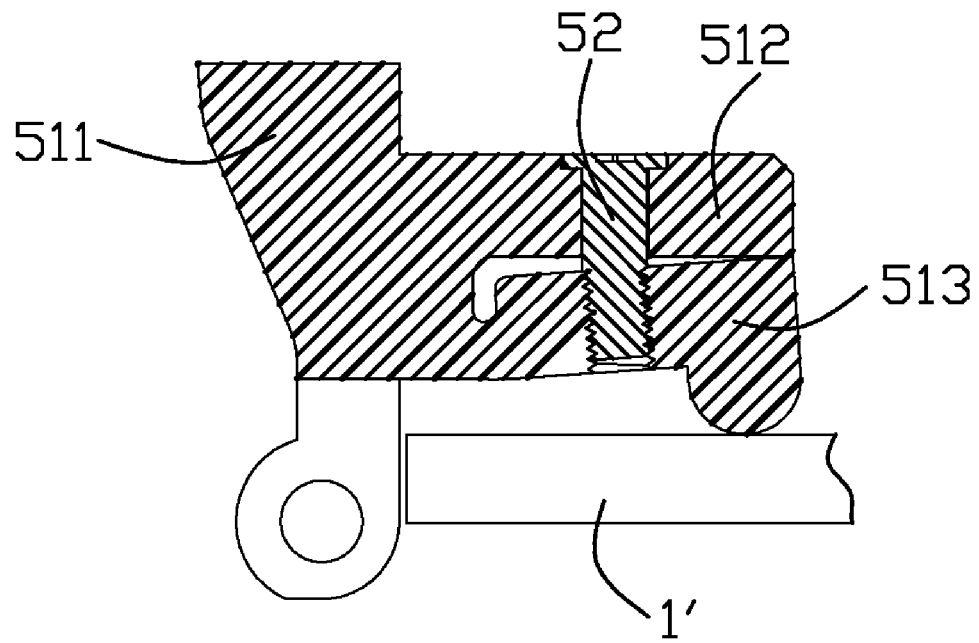
FIG. 5 is a cross-sectional view of the latch device disposed in a pressed state.

FIG. 4 is a cross-sectional view of the latch device 5, in which the latch device 5 is in an initial position to match an IC with a first thickness, and FIG. 5 is a cross-sectional view illustrating the latch device 5 in a second position to match an IC with a second and larger thickness. Referring to FIG. 4, in the case that an IC package 1 of a first thickness is loaded into the socket body, the projection 5131 of the lower section 513 is in a substantially horizontal position and abuts against the IC package 1. Referring to FIG. 5, when an IC package 1' of a second and larger thickness is loaded, the regulator 52 is rotated clockwise to lift the lower section 513 up to provide a larger space under the projection 5131 for receiving the IC package 1'.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An IC socket for receiving an IC package comprising: a socket body for carrying the IC package; a plurality of contacts received in the socket body for electrical connection with the IC package; a driving member mounted upon the socket body and being able to be operated between an upper position and a lower position; and at least one latch device having a bias portion configured with a curved surface and pivotally mounted to the socket body and driven by the driving member to shift between a closed position and an opened position, the latch device having an upper section, a lower section located below and distant with respect to the upper section such that a slot arranged therebetween to allow the low section to move with respect to the upper section, the slot having a L-shaped configuration and partially extends into the lower section, and pressing the IC package toward the socket body, and a regulator interconnecting with the upper section and the lower section respectively, to adjust a position of the lower section relative to the upper section.

2. The IC socket as claimed in claim 1, wherein the upper section and the lower section are substantially positioned parallel to each other.

3. The IC socket as claimed in claim 2, wherein the slot is substantially formed with a L-shaped configuration and partially extends into the lower section.

4. The IC socket as claimed in claim 3, wherein the regulator is a screw, and the upper section and the lower section together define a receiving hole for receiving the screw, and a part of the receiving hole passing through the lower section has internal threads to lock with the regulator.

5. The IC socket as claimed in claim 1, the curve surface includes a lowest point for pressing the IC package disposed therein.

6. The IC socket as claimed in claim 1, wherein the lower section is integrally formed with the upper section.

7. An IC socket for receiving an IC package comprising: a socket body for carrying the IC package; a plurality of contacts received in the socket body for electrical connection with the IC package; a driving member mounted upon the socket body and being able to operate between an upper position and a lower position; and at least a latch device including a stationary portion and a moveable portion arranged with a slot with respect to the stationary portion such that the moveable portion is capable of being lifted or lowered, wherein the slot having a L-shaped configuration and partially extends into the lower section.

8. The IC socket as claimed in claim 7, wherein the stationary portion is paralleled to the moveable portion.

9. The IC socket as claimed in claim 8, wherein stationary portion and the moveable portion each defines a receiving hole for receiving the screw, a screw is inserted into the receiving hole to drive the moveable portion to move up and down relative to the stationary portion.

10. The IC socket as claimed in claim 9, wherein the moveable portion has a projection at a free end thereof for pressing the IC package.

11. The IC socket as claimed in claim 10, wherein when the IC package of a thicker thickness is loaded in, the screw is rotated clockwise to drive up the moveable portion to provide a large space under the moveable portion for receiving the IC package.

12. The IC socket as claimed in claim 11, wherein a part of the receiving hole passing through the moveable portion has internal threads to lock with the screw.

13. An IC socket for receiving an IC package comprising: a socket body for carrying the IC package; a plurality of contacts received in the socket body for electrical connection with the IC package; a driving member mounted upon the socket body and being able to be operated between an upper position and a lower position; and at least a pair of latch devices driven by the driving member to shift between a closed position and an opened position, each latch device having an upper section, a lower section located below and substantially parallel to the upper section, such that a slot created therebetween to allow the low section to move with respect to the upper section, the slot having a L-shaped configuration and partially extends into the lower section, and a regulator interconnecting with the upper section and the lower section respectively, to adjust a position of the lower section.

14. The IC socket as claimed in claim 13, wherein the lower section is integrally formed with the upper section and presses the IC package toward the socket body.

15. The IC socket as claimed in claim 13, wherein said lower section is more flexible than the upper section.

* * * * *